United States Patent [19]

Guillard et al.

[11] Patent Number: 5,315,257
[45] Date of Patent: May 24, 1994

[54] SYSTEM FOR EVALUATING THE PERFORMANCE OF AN ELECTRICAL FILTER

[75] Inventors: Jacques Guillard, Le Chesnay; Christian Girard, Sartrouville; Pierre Morin, Gif sur Yvette, all of France

[73] Assignee: Alcatel Cable, Clichy Cedex, France

[21] Appl. No.: 834,591

[22] Filed: Feb. 12, 1992

[30] Foreign Application Priority Data

Feb. 13, 1991 [FR] France ............... 91 01667

[51] Int. Cl.⁵ .................................. G01R 27/00
[52] U.S. Cl. .......................... 324/627; 324/605; 324/612
[58] Field of Search .......... 324/602, 605, 606, 607, 324/612, 615, 619, 627

[56] References Cited

U.S. PATENT DOCUMENTS

| | | | |
|---|---|---|---|
| 3,492,568 | 1/1970 | Johnson | 324/627 |
| 3,651,400 | 3/1972 | McMartin et al. | 324/627 |
| 3,764,894 | 10/1973 | Dukek et al. | 324/453 |
| 3,781,668 | 12/1973 | Aillet | 324/612 |
| 4,093,914 | 6/1978 | Peppiatt et al. | 324/619 |
| 4,647,844 | 3/1987 | Biegon et al. | 324/627 |
| 5,194,818 | 3/1993 | Scheibner | 324/617 |

OTHER PUBLICATIONS

Journal of Physics E. Scientific Instruments, vol. 16, No. 11, Nov. 1983, Dorking, GB, pp. 1003-1012; L. Weichert: "The avoidance of electric interference in instruments."

Revue Generale de L'Electricite, No. 2, Feb. 1987, Paris, France, pp.64-67; Champiot et al.: "Sensibilite Des Equipements Electroniques Aux Decharges Electrostatiques: La Norme CEI 801-2."

Digest of Technical Papers; 7th IEEE Pulsed Power Conf.; Monterey, Calif. Jun. 11-14, 1989, pp. 372-375 White et al.: "A Wide Bandwidth, High Dynamic Range, Analog Fiber Optic Link for EMP and EMC Testing."

*Primary Examiner*—Kenneth A. Wieder
*Assistant Examiner*—Glenn W. Brown
*Attorney, Agent, or Firm*—Sughrue, Mion, Zinn, Macpeak & Seas

[57] ABSTRACT

A system for evaluating the performance of an electrical filter installed on an electrical power supply network passing through the screening of a Faraday enclosure, includes a transmit device for transmitting an inlet electrical pulse to the inlet of the filter. A receive and processing unit receives and processes the response electrical signal at the outlet of the filter corresponding to the pulse. A display displays the results obtained by processing the signal. The inlet electrical pulse is coupled to the power supply network and is conveyed thereby through the filter. The response is obtained from the outlet of the filter by decoupling.

10 Claims, 2 Drawing Sheets

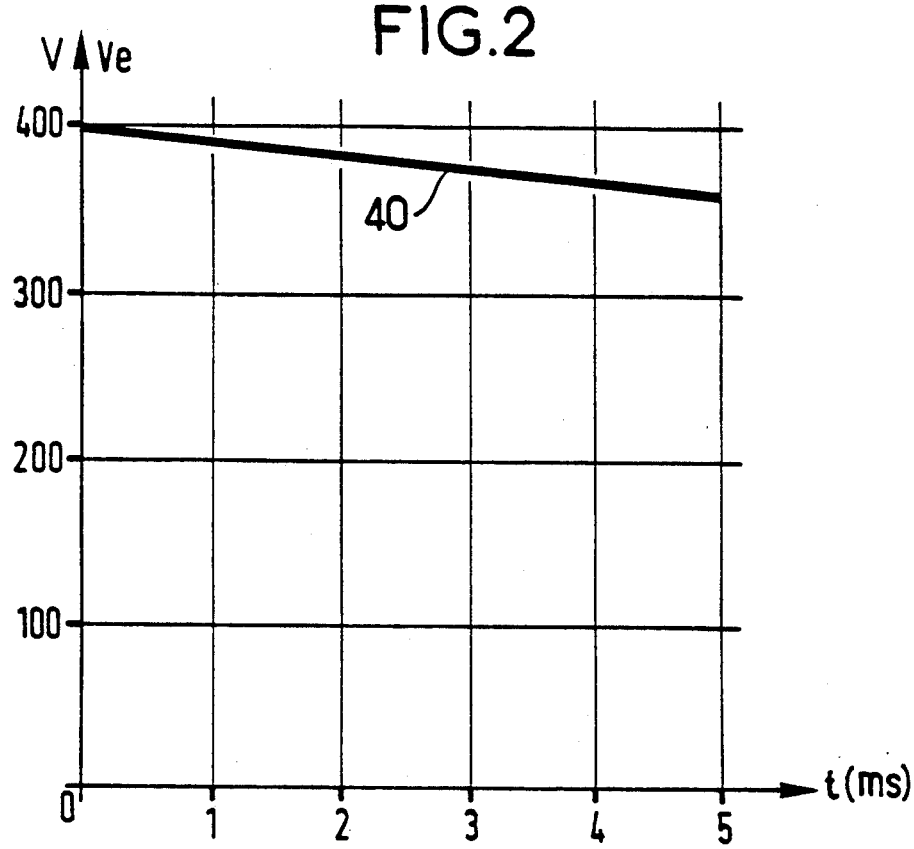
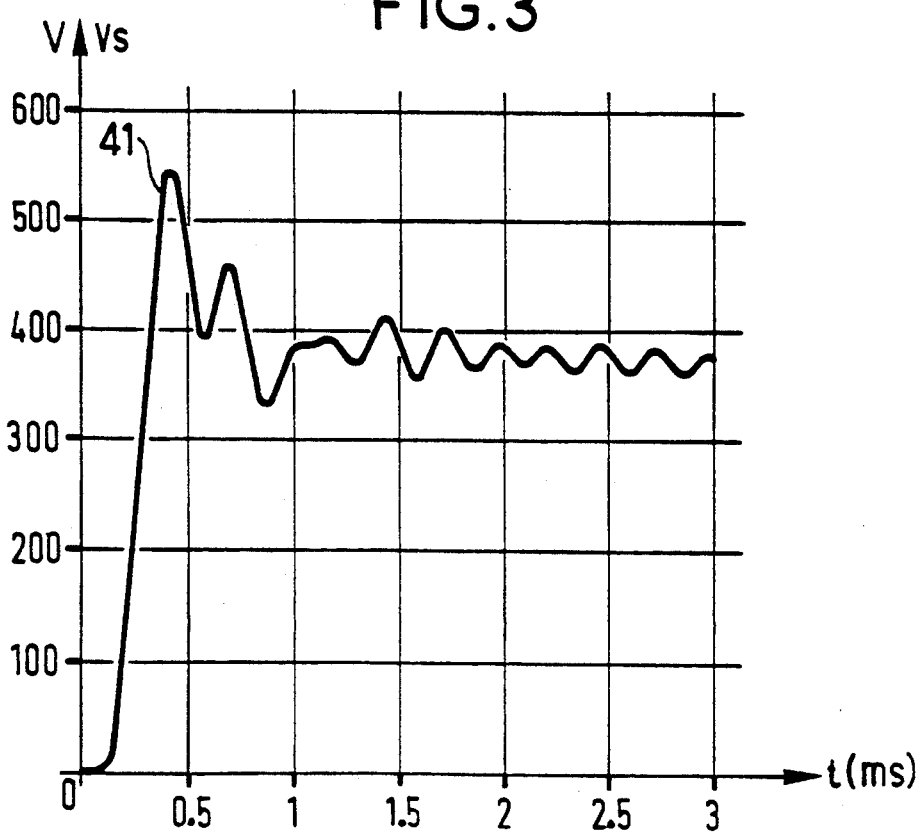

SYSTEM FOR EVALUATING THE PERFORMANCE OF AN ELECTRICAL FILTER

The present invention relates to a system for evaluating the performance of an electrical filter, the system being for use in particular for evaluating the performance of power supply filters used on Faraday cages.

For reasons of clarity and of simplicity, the description below is solely in terms of power supply filters used on Faraday cages. However, the reader will understand that this restriction is in no way limiting and that the present invention relates to evaluating the performance of any type of electrical filter.

BACKGROUND OF THE INVENTION

Power supply filters, and most particularly anti-interference filters, are lowpass filters used to protect equipment inside or outside Faraday cages from radio frequency disturbances. They are installed, in particular, where power supply cables coming from the mains (public utility or otherwise) penetrate into the cage, e.g. for the purpose of powering equipment to be found inside the cage (with such power mains being referred to herein as "power networks"). Such feedthroughs can facilitate electromagnetic leakage to the outside. Such leakage can have two major consequences, amongst others:

damaging equipment outside the cage; and giving rise to leakage of secret information in the form of radio signals that can be picked up by external antennas (this consequence is damaging particularly in military applications): to avoid such leakage, anti-interference electrical filters are used, and may be referred to as "anti-eavesdropping filters".

Anti-interference filters are thus essential to enable a Faraday cage to be effective, and for that purpose they must attenuate signals at frequencies that lie outside their passbands. In the same way as it is necessary to verify the screening performance of the cage, it is also necessary to verify the performance of an anti-interference filter. This is to verify whether an operating filter is performing its function properly, i.e. if an outlet voltage from the filter is sufficiently attenuated relative to an inlet voltage outside its passband to prevent any type of leakage.

Such performance evaluation is particularly important since filter components (inductors, capacitors, ...) age poorly, degrading over time and thus running the risk of reducing the protection provided by the filter and thus by the cage itself.

The performance of such filters is thus evaluated in conventional manner during maintenance periods that take place once every one or two years, or whenever a defect is detected. For evaluation purposes, the filter must be disconnected from the power network, its inlet connected to a generator and its outlet to a receiver. External transmission and reception means must thus be brought on site. The test is then performed by reconstituting the response of the filter over the entire frequency band, i.e. by reconstituting its transfer function Such conventional procedures are inconvenient and lengthy. Throughout the duration of the test, the user of the equipment situated inside the cage is no longer supplied with electricity, so the equipment must be turned off. In addition, the test equipment is bulky and inconvenient to install.

Furthermore, to reconstitute the frequency response of a filter, it is necessary to perform tests at different frequencies, which is fiddly, particularly since the test must be repeated for each of the filters present on the cage.

Finally, if the result of the test is to be displayed inside the cage to inform a user, then it is necessary to transmit information via an electrical cable entering the cage. Unfortunately, that cable itself constitutes an additional source of leakage so it too requires a filter. In practice, the result of the test is therefore never sent to a user inside the cage.

The object of the present invention is thus to provide a system for evaluating the performance of a filter that enables the transfer function of the filter to be verified simply and quickly on user command or on a permanent basis and without disconnecting the power network.

SUMMARY OF THE INVENTION

To this end, the present invention provides a system for evaluating the performance of an electrical filter installed on an electrical power supply network passing through the screening of a Faraday enclosure, the system comprising:

transmit means for transmitting an inlet electrical pulse to the inlet of said filter;

receive and processing means for receiving and processing the response electrical signal at the outlet of said filter and corresponding to said pulse; and display means for displaying the results obtained after processing said signal;

wherein said inlet electrical pulse is coupled to said power supply network and is conveyed thereby through said filter, said response being obtained from the outlet of said filter by decoupling.

According to an important feature, said response coupled to said power supply network is decoupled from said network by means of a filter whose passband is such that said response has a frequency belonging to said passband, while said network has a frequency that does not belong to said passband.

In addition, the transmission means may be controlled by an optical signal triggering an electrical pulse generator. Under such circumstances, the optical signal is transmitted by an optical fiber cable to receiver means for said optical signal, and it is possible to trigger the pulse generator by transforming the optical signal into an electrical signal.

Advantageously, said inlet electrical pulse is coupled to said power supply network by coupling means selected from: a directional coupler, a current probe, and a directly-connected capacitor.

According to another important feature, said receive and processing means comprise:

electronic sorting means for sorting said response to conserve only characteristic values of said response: rise time, maximum amplitude, and frequency components;

analog-to-digital converter means for converting said characteristic values obtained in this way;

comparator means for comparing said characteristic values as obtained with corresponding pre-established thresholds.

Advantageously, when the user of said system is inside said Faraday-screened enclosure, and said receive and processing means are outside said enclosure, while said display means are inside, said means are interconnected by an optical fiber cable, with the result obtained after processing of said response then being transformed into an optical signal to be conveyed by said cable.

When the result obtained after said processing exceeds a pre-established threshold, said result triggers a warning signal at said display means, the warning signal being selected from a visible warning and an audible warning.

It is possible to use a pulse that is calibrated in duration and in amplitude.

Finally, said transmit means may be inside said enclosure and said receive and processing means may be outside said enclosure.

BRIEF DESCRIPTION OF THE DRAWINGS

An embodiment of the invention is described by way of example with reference to the accompanying drawings, in which:

FIGS. 2 and 3 are curves corresponding respectively to the inlet pulse and the response to said inlet pulse.

DETAILED DESCRIPTION

Figure 1:
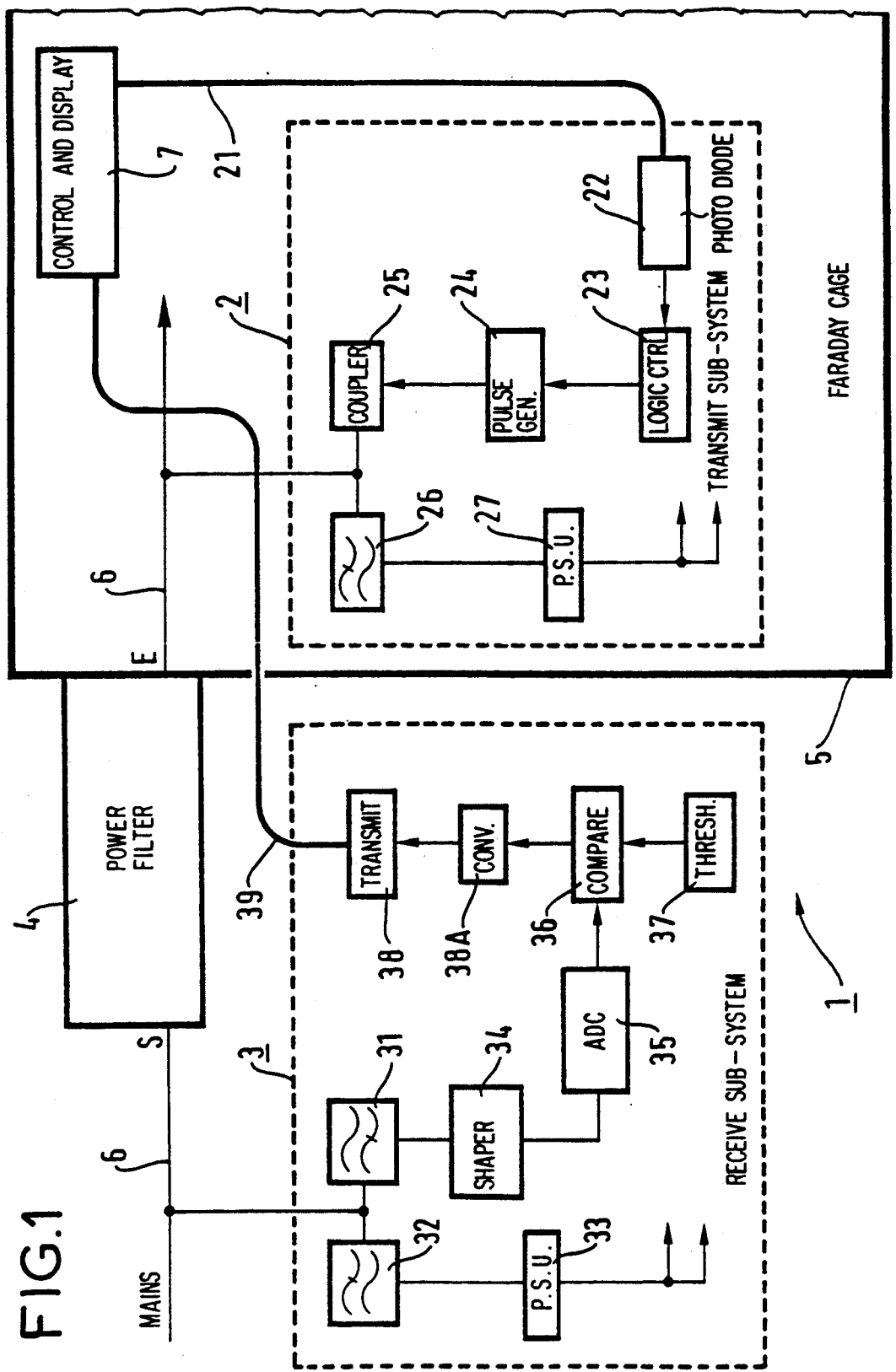
FIG. 1 is a block diagram of a system of the invention.

In FIG. 1, the system 1 of the invention comprises two subsystems 2 and 3 (where the subsystem 2 is a transmit subsystem and subsystem 3 is a receive subsystem); an anti-interference power filter 4 mounted as a feedthrough on a Faraday cage 5 for connecting a power network 6; and a control and display device 7 situated inside the cage 5 for controlling the test and displaying the result of the test.

The subsystem 2 situated inside the cage 5 is controlled by the device 7 which enables a user desiring to test the filter 4 to trigger a test for evaluating the performance of the filter 4 whenever required by means of a control button (not shown). The device 7 is connected by an optical fiber cable 21 to an optical receiver 22 comprising a photodiode. On receiving the optical control signal, the receiver 22 transforms this signal into an equivalent electrical signal which changes the state of a logical control circuit 23 and triggers an electrical pulse generator 24.

The pulse generator 24 periodically supplies a pulse $V_e$ whose waveform is given by curve 40 in FIG. 2. The characteristics of the pulse and the reasons for selecting them are explained in greater detail below. A directional coupler 25 couples the pulses generated by the generator 24 to the power network 6 at the inlet E of the filter 4. The power network 6 powers both the equipment that is inside the cage 5 and the various electrical circuits constituting the system 1.

The pulses $V_e$ supplied by the generator 24 and coupled to the power network 6 are superimposed on the power supply voltage U, and as a result they could give rise to power surges harmful to the circuits being powered. To avoid this, the coupled voltage is filtered by means of a lowpass filter 26 situated on the power network 6 upstream from a circuit power supply system 27. The filter 26 eliminates the voltage $V_e$ which passing the power supply voltage U which is at a frequency of 50 Hz, 60 Hz, or 400 Hz, depending on country and circumstances.

At the outlet S of the filter 4, a signal is obtained which is the sum of the outlet voltage $V_s$ (see curve 41 in FIG. 3) corresponding to the voltage $V_e$ as attenuated by the filter 4, and the power supply voltage U which is practically unattenuated (the filter 4 is a lowpass filter).

For the purpose of processing and analyzing $V_s$, the signal from the filter 4 passes through a highpass filter 31 for eliminating the power supply voltage U and for decoupling the voltage $V_s$ from the voltage U.

In addition, the receive subsystem 3 situated outside the cage 5 has another lowpass filter 32 having the same function as the lowpass filter 26: it serves to eliminate $V_s$ and to supply the various circuits solely with the voltage U that is suitable for powering them (33).

The signal $V_s$ is applied to an electronic shaping circuit 34 where it is electronically sorted, thereby enabling the curve 41 showing the main characteristics of $V_s$ to be deduced (which characteristics are explained below). The output therefrom is then converted into digital values by an analog-to-digital converter 35. The characteristics obtained are compared in a comparator 36 having pre-fixed tolerance thresholds 37, and the electrical signal obtained at the output of the comparator 36 is transformed into an optical signal by a converter 38A and is then transmitted to the device 7 via an optical transmitter 38 and an optical fiber cable 39 that passes into the Faraday cage 5.

When the characteristic values exceed the tolerance thresholds, the optical signal transmitted by the cable 39 triggers a visible or an audible signal at the device 7 informing the user that the filter is faulty, for example.

The system of the invention thus uses the power network to convey the inlet test pulse and the corresponding response obtained from the outlet of the filter 4. By appropriate filtering using highpass and lowpass filters, the pulses generated by the generator 24 do not disturb the power supply to the circuits of the system, and the corresponding outlet signal is decoupled from the power supply voltage. The performance of the filter can thus be evaluated without disconnecting the power network, and this also makes it possible to connect the system of the invention permanently to the filter 4 to be tested. In addition, the pulses $V_e$ generated by the generator 24 (see curve 40 in FIG. 2) are calibrated in duration (rise time about 1 nanosecond) and in amplitude (maximum amplitude about 400 V) to obtain an outlet signal $V_s$ (see curve 41 in FIG. 3) which is characterized by its rise time (time taken to reach maximum amplitude), its maximum amplitude, and the frequency components of its ringing. It can then be shown by means of the properties of the Fourier transform that these characteristic values are related to the coefficients of the transfer function of the filter, which coefficients are themselves functions of the parameters of the filter, i.e. the values of the inductances and capacitances constituting the filter.

Thus, by calculating the characteristic values of the output voltage delivered by the electronic shaping circuit and by comparing these values in the comparator 36 with acceptable limit values, it is possible to determine whether the components of the filter have deteriorated or not.

Consequently, because of the signal processing performed, there is no need to establish the frequency response of the filter to determine the state of the filter. This avoids the need to test the filter at a large number of frequencies in its passband, and thus makes performance evaluation relatively fast: the result is obtained a few seconds after the generator has generated a pulse.

Finally, by transmitting the final result to the user over optical fibers it is possible to avoid degrading the electromagnetic screening provided by the Faraday cage.

Naturally, the invention is not limited to the implementation described above.

Firstly, the system of the invention may be used on any type of electrical filter regardless of whether it is used on a Faraday cage or on a screened enclosure. For example, it may be used for continuously or cyclically verifying electromagnetic compactibility filters or auxiliary filters installed on networks that constitute accessories to Faraday cages (fire detection, alarm circuits, trip-switches, various kinds of signalling, telephone circuits, intercoms, ... ).

In addition, if the coupling system used in the transmit subsystem is sufficiently directional, there is no need to use a lowpass filter in this subsystem. Under such circumstances, pulses from the generator are coupled to the power network and go to the filter without disturbing power supply to the powered circuits. However, it is preferable in practice to use a lowpass filter in association with a directional coupler, a current probe, or a directly-connected capacitor.

In addition, the shape and the characteristics of the pulse are functions of the filter to be tested, and are not limited in any way to the example given above.

Furthermore, all of the filters of a given apparatus can be tested by injecting a common mode voltage at the inlets thereof and by picking up an outlet signal likewise in common mode. This provides a qualitative overall response concerning the general state of the circuits. If the overall response indicates that deterioration is present, is it then necessary to test each filter separately to determine which filter(s) is/are suffering from degraded performance.

The system of the invention also makes it possible to display the voltage $V_s$ together with its characteristic values. The system of the invention can thus provide a filter test reading.

Finally, the system of the invention may be powered either by current or by voltage.

Naturally, any of the means may be replaced by equivalent means without going beyond the ambit of the invention.

We claim:

1. A system for evaluating the performance of an electrical filter installed on an electrical power supply network passing through the screening of a Faraday enclosure, the system comprising:
   transmit means for transmitting an inlet electrical pulse to the inlet of said filter;
   receive and processing means for receiving and processing a response electrical signal at the outlet of said filter corresponding to said pulse; and
   display means for displaying the results obtained by processing said signal;
   wherein said inlet electrical pulse is coupled to said power supply network and is conveyed thereby through said filter, said response being obtained from the outlet of said filter by decoupling.

2. A system according to claim 1, wherein said response is decoupled from said power supply network by means of a filter whose passband is such that said response has a frequency belonging to said passband, and said network has a frequency that does not belong to said passband.

3. A system according to claim 1, wherein said transmit means are controlled by an optical signal triggering an electrical pulse generator.

4. A system according to claim 3, wherein said optical signal is transmitted by an optical fiber cable to means for receiving said optical signal and for transforming said optical signal into an electrical signal enabling said pulse generator to be triggered.

5. A system according to claim 1, wherein said inlet electrical pulse is coupled to said power supply network by coupling means selected from the group consisting of: a directional coupler, a current probe, and a directly-connected capacitor.

6. A system according to claim 1, wherein said receive and processing means comprise:
   electronic sorting means for sorting said response to conserve only characteristic values of said response: rise time, maximum amplitude, and frequency components;
   analog-to-digital converter means for converting said characteristic values obtained in this way;
   comparator means for comparing said characteristic values as obtained with corresponding pre-established thresholds.

7. A system according to claim 1, wherein said receive and processing means are outside said enclosure, said display means are inside said enclosure, said receive and processing means and said display means are interconnected by an optical fiber cable, and a result obtained by processing of said response is transformed into an optical signal to be conveyed by said cable.

8. A system according to claim 1, wherein, when the result obtained from processing exceeds a pre-established threshold, said result triggers a warning signal at said display means, the warning signal being selected from a visible warning and an audible warning.

9. A system according to claim 1, wherein said pulse is calibrated in duration and in amplitude.

10. A system according to claim 1, wherein said transmit means are inside said enclosure and in that said receive and processing means are outside said enclosure.

* * * * *